US011346918B1

(12) United States Patent
Ganwani et al.

(10) Patent No.: US 11,346,918 B1
(45) Date of Patent: May 31, 2022

(54) ADAPTIVE GAIN CONTROL FOR INDOOR POSITIONING

(71) Applicant: Marvell International Ltd., Hamilton (BB)

(72) Inventors: Vijay Ganwani, Pune (IN); Christian Raimund Berger, San Jose, CA (US); Sih-Yu Lin, Newark, CA (US); Niranjan Grandhe, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 387 days.

(21) Appl. No.: 16/571,117

(22) Filed: Sep. 15, 2019

Related U.S. Application Data

(60) Provisional application No. 62/749,354, filed on Oct. 23, 2018.

(51) Int. Cl.
*G01S 5/02* (2010.01)
*H03G 3/30* (2006.01)
*H04W 52/52* (2009.01)
*G01S 5/04* (2006.01)
*G01S 5/06* (2006.01)

(52) U.S. Cl.
CPC ............ *G01S 5/0221* (2013.01); *H03G 3/30* (2013.01); *H03G 3/3068* (2013.01); *H04W 52/52* (2013.01); *G01S 5/04* (2013.01); *G01S 5/06* (2013.01); *G01S 2201/02* (2019.08)

(58) Field of Classification Search
CPC ................................ G01S 5/0221; G01S 5/06
See application file for complete search history.

(56) References Cited

U.S. PATENT DOCUMENTS

| 7,212,798 B1* | 5/2007 | Adams | H03G 3/3068 330/278 |
| 8,064,862 B2* | 11/2011 | Rudberg | H04B 7/0811 455/277.2 |
| 8,929,192 B2* | 1/2015 | Kainulainen | G01S 1/08 370/203 |
| 9,172,344 B2* | 10/2015 | Green | H03G 3/3073 |
| 9,702,963 B2* | 7/2017 | Kalliola | G01S 5/02 |
| 9,860,096 B1 | 1/2018 | Ganwani et al. | |

(Continued)

OTHER PUBLICATIONS

Bluetooth Core Specification, version 5.1, Chapter 8, vol. 1, part A (pp. 1-3, 174-179, 281-284), Jan. 21, 2019.

(Continued)

*Primary Examiner* — Gregory C. Issing

(57) ABSTRACT

An interrogation device, for locating a wireless device, includes a receiver and digital processing circuitry. The receiver includes one or more receiver stages having adjustable gains, and is configured to receive from the wireless device a signal that carries a packet including a direction-finding field, wherein, during reception of the direction-finding field, multiple different temporal sections of the received signal traverse different wireless channels due to switching among different antennas in the interrogation device or in the wireless device and thus have multiple different received-signal levels. The digital processing circuitry is configured, based on the multiple received temporal sections of the signal during reception of the direction-finding field, to (i) adapt the adjustable gains of the receiver stages and (ii) estimate a position of the wireless device.

14 Claims, 4 Drawing Sheets

(56) References Cited

U.S. PATENT DOCUMENTS

| | | | |
|---|---|---|---|
| 2004/0259511 A1* | 12/2004 | Liu | H03G 3/3052 |
| | | | 455/136 |
| 2006/0071841 A1* | 4/2006 | Yang | H03M 1/185 |
| | | | 341/155 |
| 2012/0319774 A1* | 12/2012 | Ibrahim | H03G 3/3068 |
| | | | 330/129 |
| 2013/0023278 A1* | 1/2013 | Chin | G01S 5/0205 |
| | | | 455/456.1 |
| 2018/0351592 A1* | 12/2018 | Coban | H04B 1/1036 |

OTHER PUBLICATIONS

Bluetooth, "Enhancing Bluetooth Location Services with Direction Finding", pp. 1-12, Jan. 25, 2019.

\* cited by examiner ed in "Bluetooth Core Specification," v5.1, January, 2019, which is incorporated herein by reference. Chapter 8 of volume 1, part A of this specification specifies techniques for direction finding using Bluetooth Low Energy (BLE). Some techniques involve Angle of Arrival (AOA) estimation, whereas other techniques are based on Angle of Departure (AOD) estimation. These techniques are also referred to as Public Indoor Positioning (PIP).

ADAPTIVE GAIN CONTROL FOR INDOOR POSITIONING

CROSS-REFERENCE TO RELATED APPLICATIONS

This application claims the benefit of U.S. Provisional Patent Application 62/749,354, filed Oct. 23, 2018, whose disclosure is incorporated herein by reference.

FIELD OF THE DISCLOSURE

The present disclosure relates generally to wireless positioning systems, and particularly to methods and systems for gain control in wireless positioning receivers.

BACKGROUND

Some wireless communication protocols support mechanisms for estimating the locations of wireless devices. For example, positioning mechanisms for Bluetooth® devices are described in "Bluetooth Core Specification," v5.1, January, 2019, which is incorporated herein by reference. Chapter 8 of volume 1, part A of this specification specifies techniques for direction finding using Bluetooth Low Energy (BLE). Some techniques involve Angle of Arrival (AOA) estimation, whereas other techniques are based on Angle of Departure (AOD) estimation. These techniques are also referred to as Public Indoor Positioning (PIP).

The description above is presented as a general overview of related art in this field and should not be construed as an admission that any of the information it contains constitutes prior art against the present patent application.

SUMMARY

An embodiment that is described herein provides an interrogation device for locating a wireless device. The interrogation device includes a receiver and digital processing circuitry. The receiver includes one or more receiver stages having adjustable gains, and is configured to receive from the wireless device a signal that carries a packet including a direction-finding field, wherein, during reception of the direction-finding field, multiple different temporal sections of the received signal traverse different wireless channels due to switching among different antennas in the interrogation device or in the wireless device and thus have multiple different received-signal levels. The digital processing circuitry is configured, based on the multiple received temporal sections of the signal during reception of the direction-finding field, to (i) adapt the adjustable gains of the receiver stages and (ii) estimate a position of the wireless device.

In an embodiment, the digital processing circuitry is configured to adapt the adjustable gains of the receiver stages responsively to respective received signal levels of the multiple temporal sections of the signal, and to estimate the position of the wireless device responsively to respective phases of the multiple temporal sections of the signal.

In a disclosed embodiment, the interrogation device includes (i) multiple receive antennas and (ii) switching circuitry for switching among the multiple receive antennas during reception of the direction-finding field, thereby causing the different temporal sections of the signal, during reception of the direction-finding field, to traverse the different wireless channels. In another embodiment, the receiver is configured to receive the signal, during reception of the direction-finding field, via a same antenna, but with the different temporal sections of the signal traversing different wireless channels due to switching among multiple transmit antennas in the wireless device.

In some embodiments, the receiver of the interrogation device includes an Analog-to-Digital Converter (ADC) configured to digitize the signal during reception of the direction-finding field so as to produce a sequence of signal samples, and the digital processing circuitry is configured to find a setting of the adjustable gains that (i) reduces signal underrun at an input of the ADC, and (ii) reduces signal saturation at the receiver stages.

In an example embodiment, the digital processing circuitry includes (i) an underrun counter configured to track a first count of the signal samples in which the received signal, during reception of the direction-finding field, meets a predefined underrun criterion indicative of the signal underrun at the input of the ADC, and (ii) a saturation counter configured to track a second count of the signal samples in which the received signal, during reception of the direction-finding field, meets a predefined saturation criterion indicative of the signal saturation at the receiver stages, and the digital processing circuitry is configured to modify the adjustable gains of the receiver stages based on the first count tracked by the underrun counter and the second count tracked by the saturation counter.

In an embodiment, the digital processing circuitry is configured to modify the adjustable gains of the receiver stages based on a difference between the first count and the second count. In another embodiment, the digital processing circuitry is configured to determine that a sample of the signal, during reception of the direction-finding field, meets the predefined underrun criterion in response to detecting that an absolute-value magnitude of the sample of the signal is below a predefined underrun threshold. In yet another embodiment, the digital processing circuitry is configured to decide that the signal, during reception of the direction-finding field, meets the predefined saturation criterion in response to detecting that an absolute-value magnitude of the signal exceeds a predefined saturation threshold in at least one measurement point in the receiver or in the digital processing circuitry.

There is additionally provided, in accordance with an embodiment that is described herein, a method for locating a wireless device. The method includes, in an interrogation device, which includes one or more receiver stages having adjustable gains, receiving from the wireless device a signal that carries a packet including a direction-finding field, wherein multiple different temporal sections of the received signal, during reception of the direction-finding field, traverse different wireless channels due to switching among different antennas in the interrogation device or in the wireless device and thus have multiple different received-signal levels. Based on the multiple received temporal sections of the signal during reception of the direction-finding field, (i) the adjustable gains of the receiver stages are adapted and (ii) a position of the wireless device is estimated.

The present disclosure will be more fully understood from the following detailed description of the embodiments thereof, taken together with the drawings in which:

DETAILED DESCRIPTION OF EMBODIMENTS

Figure 1:
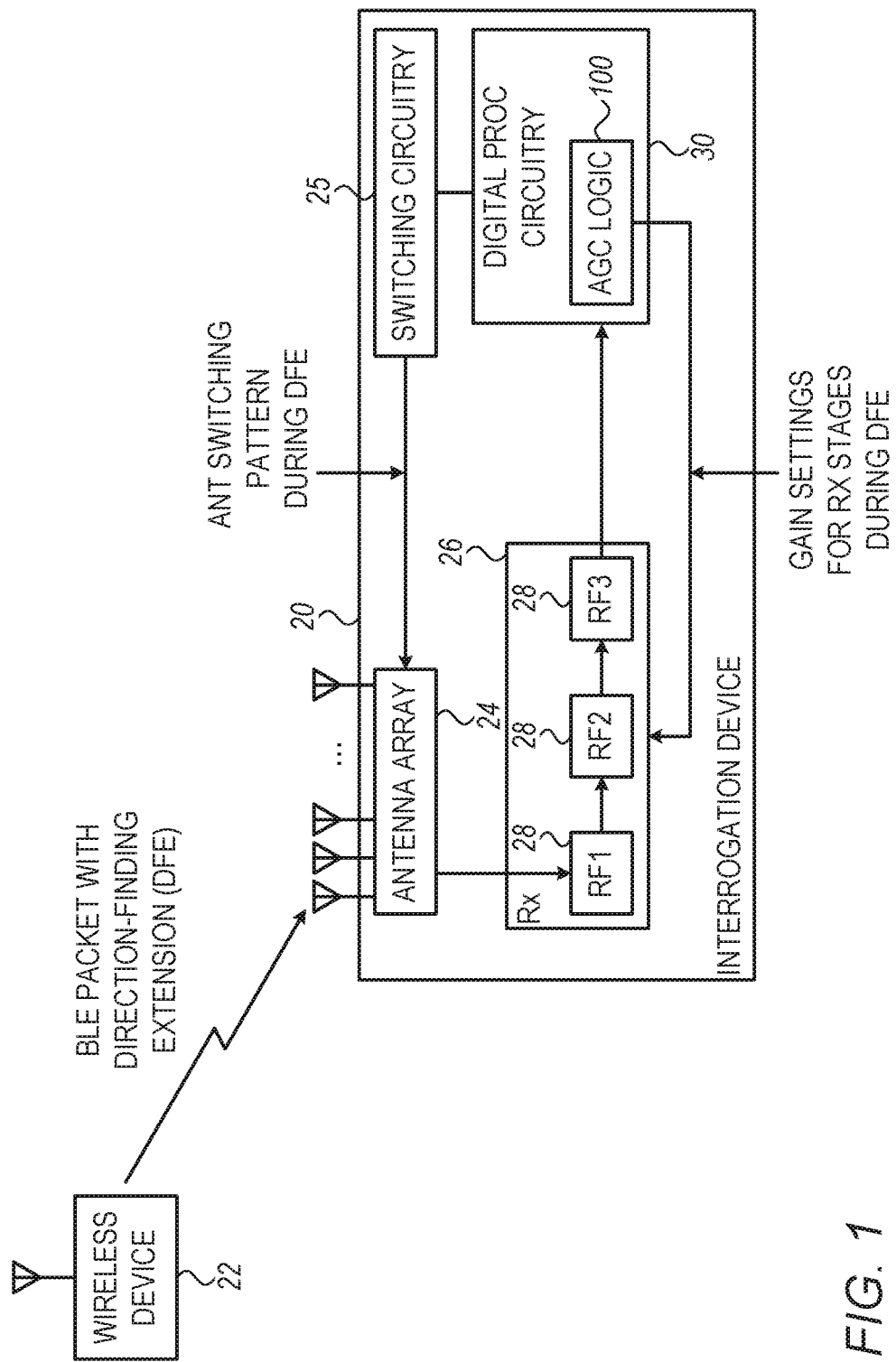
FIG. 1 is a block diagram that schematically illustrates a Bluetooth Low Energy (BLE) communication system, in accordance with an embodiment that is described herein.

Public Indoor Positioning (PIP) techniques are used for estimating the position of a Bluetooth Low Energy (BLE) device in an indoor environment. PIP is useful in a variety of applications. A typical PIP scenario involves a wireless device, and an interrogation device that estimates the position of the wireless device.

In one example use-case, a BLE wireless device is embedded in a smartphone of a user. The interrogation device is installed in a shopping mall and is used for pinpointing the location of the user within the mall. An application ("app") on the user's smartphone uses the estimated location to direct the user to a shop of interest, to direct advertisements ("ads") to the user based on his or her location in the mall, and the like.

In another use-case, multiple BLE wireless devices are fitted in objects that warrant location-tracking in a facility, such as in packages in a warehouse, in portable medical equipment in a hospital, or in electronic test equipment in a lab. The interrogation device tracks the locations of the objects, for example for inventory control and management. The two use-cases above are given solely by way of example. The disclosed techniques can be used in any other suitable environment for any other suitable application.

In accordance with the Bluetooth specification, the wireless device transmits packets that comprise a direction-finding field referred to as Direction-Finding Extension (DFE). The DFE contains constant data—an all-ones sequence that does not undergo any whitening filtering. The DFE length is typically between 0-20 octets.

In AOA-based positioning, the wireless device transmits the DFE via a single transmit antenna, and the interrogation device receives respective sections of the DFE in alternation via multiple receive antennas. The interrogation device typically receives other parts of the packet (other than the DFE) via a single receive antenna. In AOD-based positioning, the wireless device transmits respective sections of the DFE in alternation via multiple transmit antennas, and the interrogation device receives the entire DFE via a single receive antenna. The wireless device typically transmits other parts of the packet (other than the DFE) via a single transmit antenna.

Typically, antenna switching is performed at a rate of 0.25 or 0.5 MHz. The antenna switching pattern and the DFE length are typically forwarded to the peer device over a protocol data unit (PDU) denoted ADV_PRA_IND.

In both cases (AOA and AOD), the various sections of the DFE traverse different wireless channels before being received by the interrogation device receiver. The differences in amplitude and phase between the different sections of the received DFE are indicative of the geographical position of the wireless device. The interrogation device thus estimates the wireless device location based on the multiple received sections of the DFE.

One of the prime challenges in the above-described position-estimation process is fluctuations in the received DFE signal level (power level) at the input to the interrogation device receiver. Such fluctuations are caused, for example, by variations in channel statistics between different sections of the DFE (which traverse different wireless channels), and significantly impact the estimation of phase differences. The variations in received signal level may also cause saturation in various Radio Frequency (RF) stages of the receiver, and/or cause underrun in the receiver Analog-to-Digital Converter (ADC).

Embodiments that are described herein provide methods and apparatus for Automatic Gain Control (AGC), which reduce the adverse effects of received-signal fluctuations during the reception of the direction-finding field. The disclosed techniques typically set the receiver stages to gains in which the receiver experiences little or no distortion, e.g., distortion caused by saturation or underrun. The disclosed techniques therefore improve the accuracy of phase and amplitude estimation in the interrogation device, and therefore improve the accuracy with which the interrogation device estimates the position of the wireless device.

The embodiments described herein refer mainly to reception of DFE in a BLE interrogation device, by way of non-limiting example. The disclosed techniques are applicable in a similar manner in reception of any other suitable direction-finding field, in accordance with any other suitable protocol. The disclosed techniques are applicable in AOA-based positioning, AOD-based positioning, or any other suitable position estimation scheme.

In some embodiments, the receiver of the interrogation device comprises one or more receiver stages having adjustable gains, and digital processing circuitry. The digital processing circuitry is configured to adapt the adjustable gains of the receiver stages during reception of the multiple sections of the DFE (which arrive via different wireless channels due to antenna switching in the interrogation device or in the wireless device). The digital processing circuitry is configured to estimate the position of the wireless device, based on the multiple received sections of the DFE that undergo gain adaptation in the disclosed manner. Since the gain adaptation is effective in avoiding saturation and underrun, the position estimation is highly accurate.

FIG. 1 is a block diagram that schematically illustrates a BLE communication system comprising an interrogation device 20 and a wireless device 22, in accordance with an embodiment that is described herein. Interrogation device 20 is used, possibly among other functions, for estimating the geographical location of wireless device 22.

Interrogation device 20 typically comprises an antenna array 24 comprising multiple antennas, antenna switching circuitry 25, a receiver (RX) 26 comprising multiple adjustable-gain receiver stages 28, and digital processing circuitry 30.

Typically, wireless device 22 transmits BLE packets that comprise respective payloads and Direction-Finding Extensions (DFEs). Receiver 26 receives the packets, and digital processing circuitry 30 uses the DFE signal to estimate the location of wireless device 22.

In an embodiment, during the DFE of each packet, switching circuitry 25 switches among the antennas of array 24, so that successive sections of the DFE signal are received in receiver 26 via alternating antennas. Digital processing circuitry 30 comprises Automatic Gain Control (AGC) logic 100, and additional elements, that adjust the gains of receiver stages 28 during the DFE using techniques that are described herein. By proper adjustment of the gains in receiver 26, effects such as saturation and underrun are reduced, thereby enabling accurate location estimation.

The example of FIG. 1 refers to AOA-based location estimation, in which antenna switching is applied to the receive antennas of the interrogation device. In alternative embodiments, as noted above, the disclosed techniques can be applied in AOD-based location estimation, in which antenna switching is applied to multiple transmit antennas of the wireless device.

Figure 2:
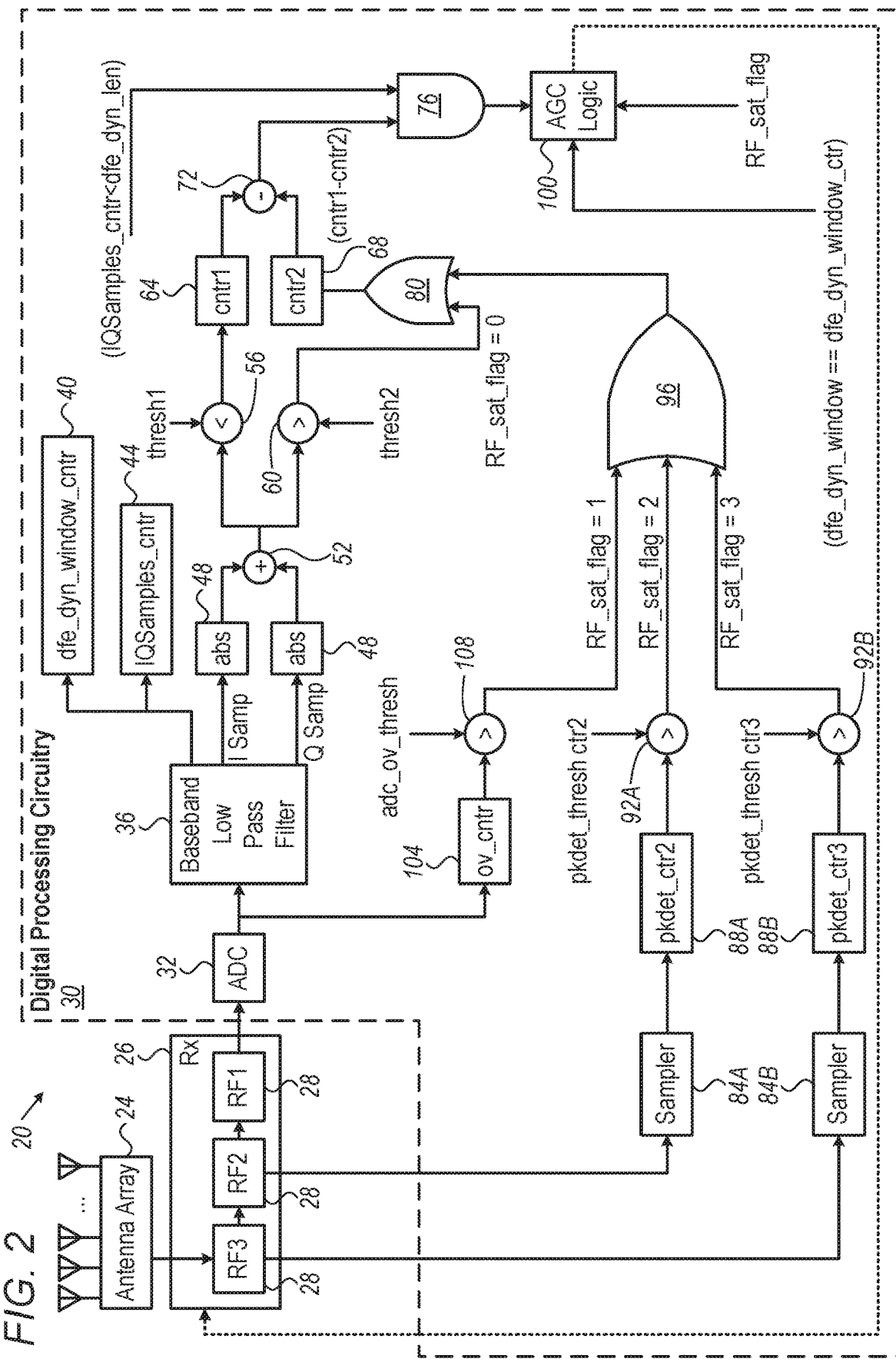
FIG. 2 is a block diagram that schematically illustrates an internal structure of the BLE interrogation device of FIG. 1, in accordance with an embodiment that is described herein.

FIG. 2 is a block diagram that schematically illustrates the internal structure of BLE interrogation device 20 of FIG. 1, in accordance with an embodiment that is described herein. As noted above, interrogation device 20 comprises antenna array 24, receiver 26 comprising multiple cascaded receiver stages 28, and digital processing circuitry 30. Receiver 26 is configured to receive Radio Frequency (RF) signals that carry packets from wireless device 22.

In the present embodiment, receiver 26 comprises a cascade of three Radio Frequency (RF) receiver stages 28 denoted RF1, RF2 and RF3. Each receiver stage 28 comprises one or more amplifiers, and possibly filters and other components. Receiver stages 28 have adjustable gains, which are controlled by digital processing circuitry 30. Typically, the gain of each receiver stage 28 is adjustable independently of the other receiver stages 28. In alternative embodiments, receiver 26 may comprise any other suitable number of receiver stages, having variable gains or otherwise, of any suitable structure.

The example of FIG. 2 depicts receiver stages that operate at RF. Additionally or alternatively, the disclosed techniques are applicable to Intermediate-Frequency (IF) receiver stages, as well. One or more of receiver stages 28 (stages RF2 and RF3 in the present example) comprise an analog signal-level detector. The outputs of these detectors, which are indicative of the signal levels at the outputs of their respective RF stages 28, are provided to digital processing circuitry 30.

Receiver 26 typically further comprises circuitry (not shown in the figure for the sake of clarity) for down-converting the received signal from RF to baseband, as well as for filtering the signal. The baseband signal output by receiver 26 is provided to digital processing circuitry 30.

In digital processing circuitry 30, an Analog-to-Digital Converter (ADC) 32 digitizes (samples) the baseband signal, and a digital baseband Low-Pass Filter (LPF) 36 filters the digitized signal. The output of LPF 36 comprises a sequence of complex-valued baseband samples, e.g., a sequence of in-phase ("I") samples and a corresponding sequence of quadrature ("Q") samples.

In some embodiments, digital processing circuitry 30 (i) decodes the payloads of packets received from wireless devices by processing the I and Q samples of the payloads, and (ii) and estimates the positions of the wireless devices by processing the I and Q samples of the DFEs. Since the present disclosure is focused on position estimation, the payload decoding process is not shown, for clarity.

Figure 4:
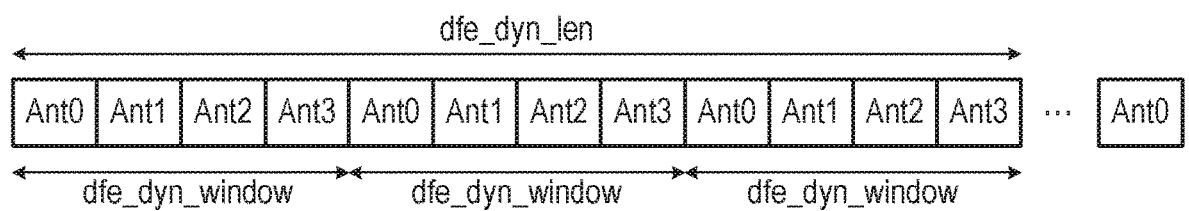
FIG. 4 is a diagram that schematically illustrates a BLE Direction-Finding Extension (DFE) and related time windows, in accordance with an embodiment that is described herein.

In an embodiment, the baseband samples produced by LPF 36 during the DFE (the direction-finding field of the packet) are processed in parallel by three elements of digital processing circuitry 30:

A dynamic-window counter 40, denoted dfe_dyn_window_cntr, counts the number of samples within a predefined time window over which the next gain setting is calculated. Typically, the DFE is divided into several windows, such that each window contains at least one complete scan over all antennas being switched. An example of a DFE that is partitioned into windows is shown in FIG. 4 below. Dynamic-window counter 40 typically is reset at the beginning of the DFE, and thereafter at the end of each window, so as to signal the end of each window and the beginning of the next window. The dynamic window length (dfe_dyn_window) typically is user-programmable.

A samples counter 44, denoted IQSamples_cntr, counts the number of samples from the start of the DFE. The total number of samples in the DFE is denoted dfe_dyn_len. Typically, samples counter 44 is reset after dfe_dyn_len samples, so as to signal the end of the DFE in a given packet.

A pair of absolute-value calculators 48 calculate the absolute-magnitude values of the I samples and the Q samples, respectively. An adder 52 sums the respective outputs of absolute-value calculators 48. Adder 52 thus outputs a sequence of "DFE magnitude samples," i.e., absolute-value magnitudes of the baseband signal during the DFE.

In an embodiment, a comparator 56 compares the DFE magnitude samples to a magnitude threshold denoted thresh1. An underrun counter 64, denoted cntr1, increments for every DFE magnitude samples that is below thresh1. Underrun counter 64 is reset at the beginning of each dynamic window dfe_dyn_window. Thus, at the end of each dynamic window dfe_dyn_window, the value of underrun counter 64 is indicative of the number of samples that suffer from underrun. Threshold thresh1 is typically user-programmable.

In an embodiment, magnitude threshold thresh1 is set to the lowest absolute-value magnitude that is considered as having sufficient Signal-to-Noise Ratio (SNR) for position estimation. DFE magnitude samples lower than this threshold are considered too noisy, typically due to underrun in ADC 32 but possibly also due to the noise floor of receiver 26. Use of such noisy samples in position estimation would degrade the estimation accuracy.

In an embodiment, a comparator 60 compares the DFE magnitude samples to a magnitude threshold denoted thresh2. A saturation counter 68, denoted cntr2, increments for every DFE magnitude samples that is above thresh2. Saturation counter 68 is reset at the beginning of each dynamic window dfe_dyn_window. Magnitude threshold thresh2 is set to the highest absolute-value magnitude that is regarded as not suffering from distortion due to saturation in receiver 26. DFE magnitude samples higher than this threshold are considered saturated, and therefore distorted and unsuitable for position estimation. Threshold thresh2 is typically user-programmable.

In some embodiments, saturation counter 68 is also incremented when saturation is detected at the output of one or more of receiver stages 28, or at the output of ADC 32. In the embodiment of FIG. 2, the outputs of the signal-level detectors of receiver stages RF2 and RF3 are provided to digital processing circuitry 30 and digitized (sampled) by samplers 84A and 84B, respectively. Peak-detectors 88A and 88B record the peaks (maximal sample values) in the signal levels of receiver stages RF2 and RF3, respectively. Comparators 92A and 92B compare the peaks to user-programmable thresholds pkdet_thresh_ctr2 and pkdet_thresh_ctr3, respectively.

In an embodiment, an ADC overflow counter 104, denoted ov_cntr, counts the number of samples in which ADC 32 is saturated. A comparator 108 compares the value of ADC overflow counter 104 to a user-programmable threshold denoted adc_ov_thresh. An OR gate 96 outputs the logical OR between the outputs of comparators 92A, 92B and 108. An OR gate 80 outputs the logical OR between the output of OR gate 96 and the output of comparator 60 (described above). The output of OR gate 80 is used for incrementing saturation counter 68.

In summary, in some embodiments, saturation counter 68 (cntr2) is incremented in response to any of the following events:

The signal at the output of receiver stage RF2 is saturated.
The signal at the output of receiver stage RF3 is saturated.
ADC 32 is in overflow.
The DFE magnitude sample (the output of adder 52) is saturated.

Thus, at the end of each dynamic window dfe_dyn_window, the value of saturation counter 68 is indicative of the number of samples that suffer from saturation in receiver 26 and/or in ADC 32.

In an embodiment, a subtractor 72 calculates the difference between the values of underrun counter 64 and saturation counter 68, i.e., (cntr1−cntr2). An AND gate 76 restricts the value (cntr1−cntr2) to be valid only when the value of samples counter 44 (IQSamples) is smaller than the length of the DFE (dfe_dyn_len). In other words, AND gate 76 outputs (cntr1−cntr2) during the DFE, and zero otherwise. The difference (cntr1−cntr2), evaluated over a certain dynamic window (dfe_dyn_window), is one of the factors being considered in specifying the gain settings of RF stages 28 for the next dynamic window, as will be explained below.

In some embodiments, digital processing circuitry 30 further comprises AGC logic 100, which controls the adjustable gains of receiver stages 28. In the present example, AGC logic 100 sets the gains of receiver stages 28 at the end of each dynamic window, i.e., several times along the DFE of a given packet. AGC logic 100 receives the following inputs:

The difference between underrun counter 64 and saturation counter 68 (cntr1−cntr2).
Dynamic window boundary signal (dfe_dyn_window==dfe_dyn_window_ctr).
RF_sat_flag—A numerical value in the range {0,1,2,3} that is set by digital processing circuitry 30 depending on the reason for saturation (the reason for incrementing saturation counter 68). As seen in FIG. 2, RF_sat_flag is set to "0" when the DFE magnitude samples are saturated (output of comparator 60), to "1" when the output of ADC 32 is at overflow (output of comparator 108), to "2" when receiver stage RF2 is saturated (output of comparator 92A), and to "3" when receiver stage RF3 is saturated (output of comparator 92B).

Figure 3:
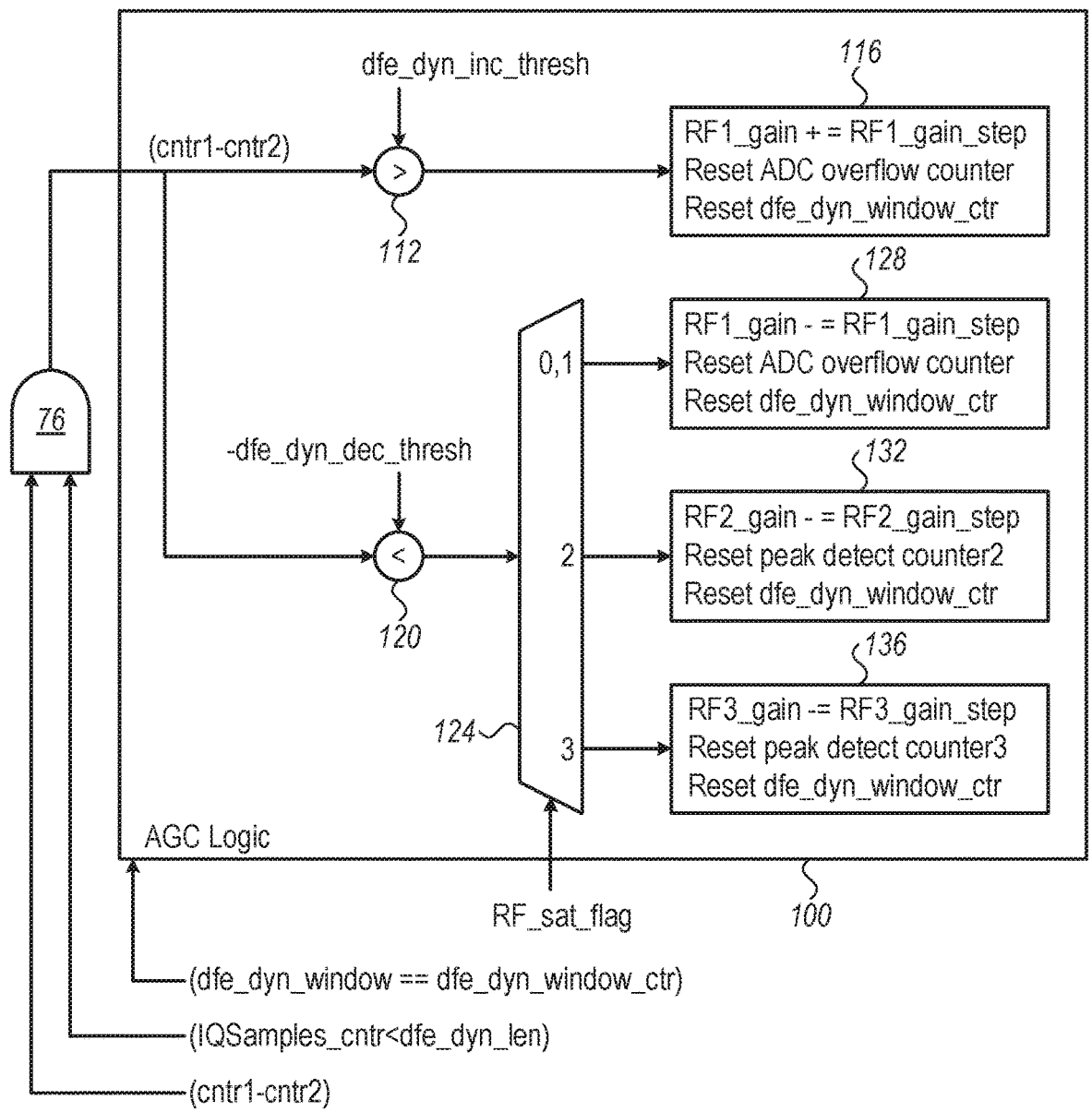
FIG. 3 is a block diagram that schematically illustrates an Automatic Gain Control (AGC) logic in the BLE interrogation device of FIGS. 1 and 2, in accordance with an embodiment that is described herein.

FIG. 3 is a block diagram that schematically illustrates AGC logic 100 in greater detail, in accordance with an embodiment that is described herein. In the present example, AGC logic 100 comprises comparators 112 and 120, a multiplexer (MUX) 124, and action blocks 116, 128, 132 and 136.

In the example of FIG. 3, AGC logic 100 increases the gain of receiver stage RF1 if (cntr1−cntr2) is positive, and is larger than a user-programmable threshold denoted dfe_dyn_inc_thresh. This threshold comparison is performed by comparator 112. If the output of comparator 112 is asserted (i.e., the gain of RF1 is to be increased), action block 116 increases the gain of RF1 by a user-programmable gain step denoted RF1_gain_step. Action block 116 also resets ADC overflow counter 104 and dynamic-window counter 40.

Continuing the present example, AGC logic 100 decreases the gain of stage RF1, RF2 or RF3 if (cntr1−cntr2) is negative, and is smaller than a user-programmable threshold denoted −dfe_dyn_dec_thresh. This threshold comparison is performed by comparator 120. If the output of comparator 120 is asserted (i.e., the gain of receiver 26 is to be decreased), AGC logic 100 invokes action block 128, 132 or 136 depending on the value of RF_sat_flag. As seen in the figure, MUX 124 selects one of action blocks 128, 132 and 136 depending on RF_sat_flag.

If RF_sat_flag=0 or RF_sat_flag=1, action block 128 decreases the gain of stage RF1 by the user-programmable gain step RF1_gain_step. Action block 128 also resets ADC overflow counter 104 and dynamic-window counter 40. If RF_sat_flag=2, action block 132 decreases the gain of stage RF2 by a user-programmable gain step denoted RF2_gain_step. Action block 132 also resets peak detector 88A (pkdet_ctr2) and dynamic-window counter 40. If RF_sat_flag=3, action block 136 decreases the gain of stage RF3 by a user-programmable gain step denoted RF3_gain_step. Action block 136 also resets peak detector 88B (pkdet_ctr3) and dynamic-window counter 40.

In the above example, AGC logic 100 defines relative priorities among receiver stages 28. The priorities determine which receiver stage will be adapted if saturation occurs simultaneously in more than one stage. In accordance with the example priority scheme, a higher RF_sat_flag value has higher priority than a lower RF_sat_flag value.

Therefore, for example, if saturation is detected at stage RF3 (RF_sat_flag set to 3) and also at stage RF1 (RF_sat_flag set to 1), only action block 136 will be invoked, and the gain of RF3 will be decreased. The rationale behind this prioritization is that gain reduction in an earlier receiver stage might resolve the saturation in a later receiver stage, but not vice versa.

In the present example, receiver stages RF2 and RF3 apply relatively coarse gain adjustments (relatively to the resolution of stage RF1). Stages RF2 and RF3 are set to their highest gains on initialization of interrogation device 20, and from this point their gains can only be decreased by AGC logic 100. Stage RF1, on the other hand, applies finer gain adjustments and is adapted in both directions (i.e., its gain can be increased or decreased as needed). Alternative embodiments, however, are in no way limited to this sort of configuration.

FIG. 4 is a diagram that schematically illustrates a BLE Direction-Finding Extension (DFE) and related time windows, in accordance with an embodiment that is described herein. The total duration of the DFE is denoted dfe_dyn_len. In this example, the total DFE duration (dfe_dyn_len) is divided into three dynamic windows (dfe_dyn_window).

As explained above, each dynamic window ends with a new setting of the gains of receiver stages 28. In other words, processing circuitry 30 calculates the desired setting for receiver stages 28 over the signal of each dynamic windows. At the end of each dynamic window, processing circuitry 30 configures receiver stages 28 to the calculated setting.

In the example of FIG. 4, each dynamic window is divided into four sections denoted {ANT0, ANT1, ANT2, ANT3}. During the section denoted ANT0 the DFE signal is received via antenna ANT0, during the section denoted ANT1 the DFE signal is received via antenna ANT1, and so on. Thus, each dynamic window contains one full scan over the four antennas {ANT0, ANT1, ANT2, ANT3} in array 24 of interrogation device 20. In alternative embodiments, any other suitable partitioning and antenna scanning pattern can be used.

The configurations of interrogation-device 20 and AGC logic 100 of FIGS. 1-3 are depicted solely by way of example. In alternative embodiments, any other suitable configurations can be used. The various elements of interrogation-device 20 and AGC logic 100 may be implemented using dedicated hardware or firmware, such as hard-wired or programmable components, e.g., in one or more Application-Specific Integrated Circuits (ASICs), Field-Programmable Gate Arrays (FPGAs) or RF Integrated Circuits (RFICs), using software, or using a combination of hardware and software elements.

In some embodiments, some or all functions of interrogation device 20, e.g., the functions of AGC block 100, may be carried out by a programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Elements of interrogation device 20 that are not mandatory for understanding of the disclosed techniques have been omitted from the figures for the sake of clarity. For example, in some embodiments digital processing circuitry 30 comprises circuitry that compensates for Carrier Frequency Offset (CFO) and/or frequency drift between the interrogation device and the wireless device. Example techniques for CFO and drift cancellation are described, for example, in U.S. Pat. No. 9,860,096, whose disclosure is incorporated herein by reference.

Figure 5:
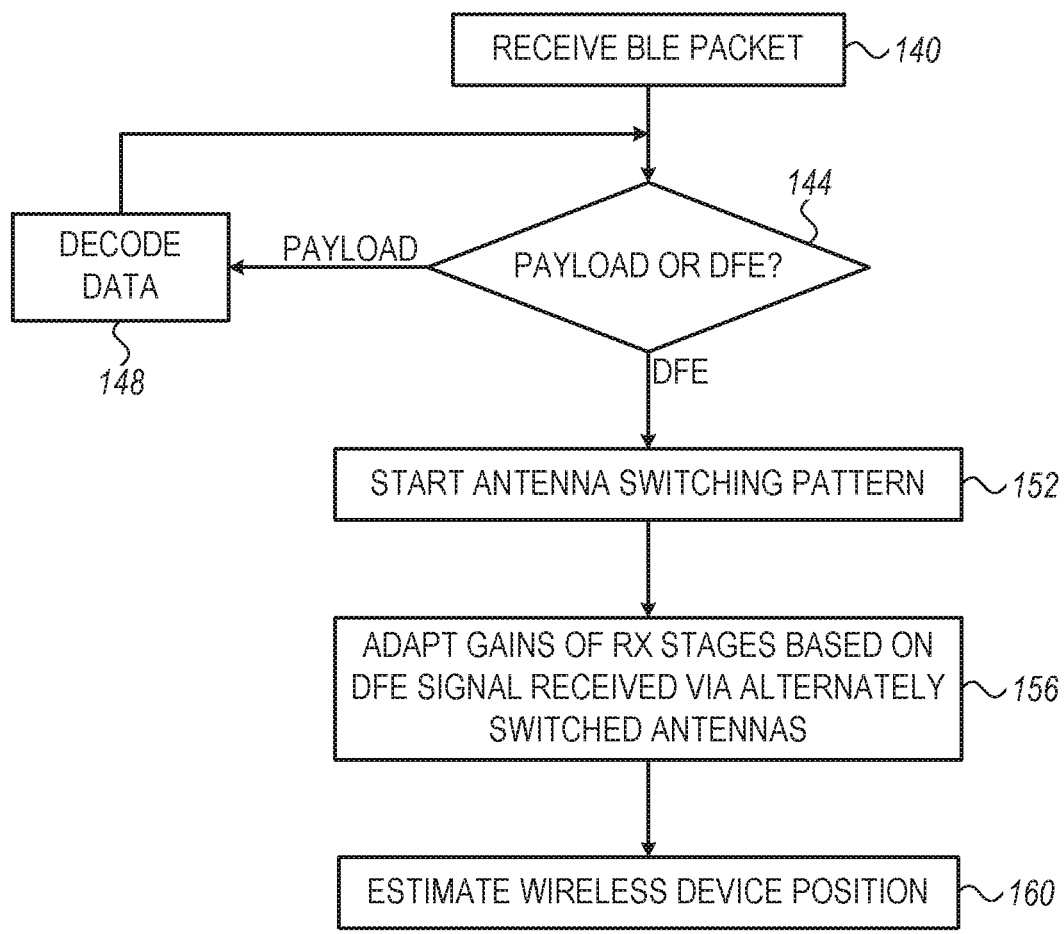
FIG. 5 is a flow chart that schematically illustrates a method for estimating a position of a BLE wireless device, in accordance with an embodiment that is described herein.

FIG. 5 is a flow chart that schematically illustrates a method for estimating a position of a BLE wireless device, in accordance with an embodiment that is described herein. The method begins in a packet reception operation 140, with receiver 26 of interrogation device 20 receiving a signal that carries a BLE packet from wireless device 22.

At a checking operation 144, digital processing circuitry 30 of interrogation device 20 checks whether the currently-received signal corresponds to the payload or to the DFE of the received packet. As long as the signal corresponds to the payload, digital processing circuitry 30 decodes the data of the payload, at a decoding operation 148, and the method looks back to checking operation 144.

When the payload ends and reception of the DFE begins, digital processing circuitry 30 instructs switching circuitry 25 to start switching among the antennas of array 24 in accordance with the predefined antenna-switching pattern, at an antenna switching operation 152. From this point, the DFE signal received by receiver 26 is received via different antennas in alternation.

At a gain adaptation operation 156, digital processing circuitry 30 adjusts the gains of receiver stages 28 based on the received DFE signal, using the techniques described above. At a position estimation operation 160, digital processing circuitry 30 estimates the position of wireless device 20 based on the DFE signal.

The method of FIG. 5 is depicted solely by way of example. In alternative embodiments, any other suitable method can be used.

Although the embodiments described herein mainly address location estimation in interrogation devices, the methods and systems described herein can also be used in other applications, such as in AGC in general, e.g., AGC in WLAN receivers that are subject to multipath fading.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An interrogation device, comprising:
    a receiver, configured to receive from a wireless device a signal that carries a packet comprising a direction-finding field, wherein, during reception of the direction-finding field, multiple different temporal sections of the received signal traverse different wireless channels due to switching among different antennas in the interrogation device or in the wireless device and thus have multiple different received-signal levels, the receiver comprising (i) one or more receiver stages having adjustable gains and (ii) an Analog-to-Digital Converter (ADC) configured to digitize the signal during reception of the direction-finding field so as to produce a sequence of signal samples; and
    digital processing circuitry, which is configured, based on the multiple received temporal sections of the signal during reception of the direction-finding field, to:
        track a first count of the signal samples in which the received signal, during reception of the direction-finding field, meets a predefined underrun criterion indicative of the signal underrun at the input of the ADC;
        track a second count of the signal samples in which the received signal, during reception of the direction-finding field, meets a predefined saturation criterion indicative of the signal saturation at the receiver stages; and
        adapt the adjustable gains of the receiver stages based on the first count and the second count.

2. The interrogation device according to claim 1, wherein the digital processing circuitry is configured to adapt the adjustable gains of the receiver stages responsively to respective received signal levels of the multiple temporal sections of the signal.

3. The interrogation device according to claim 1, wherein the interrogation device comprises (i) multiple receive antennas and (ii) switching circuitry for switching among the multiple receive antennas during reception of the direction-finding field, thereby causing the different temporal sections of the signal, during reception of the direction-finding field, to traverse the different wireless channels.

4. The interrogation device according to claim 1, wherein the receiver is configured to receive the signal, during reception of the direction-finding field, via a same antenna, but with the different temporal sections of the signal traversing different wireless channels due to switching among multiple transmit antennas in the wireless device.

5. The interrogation device according to claim 1, wherein the digital processing circuitry is configured to modify the adjustable gains of the receiver stages based on a difference between the first count and the second count.

6. The interrogation device according to claim 1, wherein the digital processing circuitry is configured to determine that a sample of the signal, during reception of the direction-finding field, meets the predefined underrun criterion in response to detecting that an absolute-value magnitude of the sample of the signal is below a predefined underrun threshold.

7. The interrogation device according to claim 1, wherein the digital processing circuitry is configured to decide that the signal, during reception of the direction-finding field, meets the predefined saturation criterion in response to detecting that an absolute-value magnitude of the signal exceeds a predefined saturation threshold in at least one measurement point in the receiver or in the digital processing circuitry.

8. A method for gain adjustment, comprising:
   in an interrogation device, which comprises one or more receiver stages having adjustable gains, receiving from a wireless device a signal that carries a packet comprising a direction-finding field, wherein multiple different temporal sections of the received signal, during reception of the direction-finding field, traverse different wireless channels due to switching among different antennas in the interrogation device or in the wireless device and thus have multiple different received-signal levels;
   digitizing the signal during reception of the direction-finding field using an Analog-to-Digital Converter (ADC) so as to produce a sequence of signal samples; and
   based on the multiple received temporal sections of the signal during reception of the direction-finding field:
      tracking a first count of the signal samples in which the received signal, during reception of the direction-finding field, meets a predefined underrun criterion indicative of the signal underrun at the input of the ADC;
      tracking a second count of the signal samples in which the received signal, during reception of the direction-finding field, meets a predefined saturation criterion indicative of the signal saturation at the receiver stages; and
      adapting the adjustable gains of the receiver stages based on the first count and the second count.

9. The method according to claim 8, wherein adapting the adjustable gains of the receiver stages is performed responsively to respective received signal levels of the multiple temporal sections of the signal.

10. The method according to claim 8, wherein receiving the signal comprises switching among multiple receive antennas of the interrogation device during reception of the direction-finding field, thereby causing the different temporal sections of the signal, during reception of the direction-finding field, to traverse the different wireless channels.

11. The method according to claim 8, wherein receiving the signal comprises receiving the signal, during reception of the direction-finding field, via a same antenna, but with the different temporal sections of the signal traversing different wireless channels due to switching among multiple transmit antennas in the wireless device.

12. The method according to claim 8, wherein modifying the adjustable gains is performed based on a difference between the first count and the second count.

13. The method according to claim 8, comprising determining that a sample of the signal meets the predefined underrun criterion by detecting that an absolute-value magnitude of the sample of the signal is below a predefined underrun threshold.

14. The method according to claim 8, comprising deciding that the signal, during reception of the direction-finding field, meets the predefined saturation criterion by detecting that an absolute-value magnitude of the signal exceeds a predefined saturation threshold in at least one measurement point in the receiver or in the digital processing circuitry.

* * * * *